(12) United States Patent
Fujiwara et al.

(10) Patent No.: US 9,991,420 B2
(45) Date of Patent: Jun. 5, 2018

(54) SEMICONDUCTOR LIGHT-EMITTING ELEMENT

(71) Applicants: STANLEY ELECTRIC CO., LTD., Meguro-ku, Tokyo (JP); THE UNIVERSITY OF TOKYO, Bunkyo-ku, Tokyo (JP)

(72) Inventors: Takako Fujiwara, Tokyo (JP); Masakazu Sugiyama, Tokyo (JP)

(73) Assignees: STANLEY ELECTRIC CO., LTD., Tokyo (JP); THE UNIVERSITY OF TOKYO, Tokyo (JP)

( * ) Notice: Subject to any disclaimer, the term of this patent is extended or adjusted under 35 U.S.C. 154(b) by 0 days. days.

(21) Appl. No.: 15/561,029

(22) PCT Filed: Mar. 22, 2016

(86) PCT No.: PCT/JP2016/058952
§ 371 (c)(1),
(2) Date: Sep. 22, 2017

(87) PCT Pub. No.: WO2016/152842
PCT Pub. Date: Sep. 29, 2016

(65) Prior Publication Data
US 2018/0062038 A1  Mar. 1, 2018

(30) Foreign Application Priority Data

Mar. 23, 2015 (JP) .................. 2015-059990

(51) Int. Cl.
*H01L 33/32* (2010.01)
*H01L 33/24* (2010.01)
(Continued)

(52) U.S. Cl.
CPC .............. *H01L 33/24* (2013.01); *H01L 33/06* (2013.01); *H01L 33/12* (2013.01); *H01L 33/145* (2013.01); *H01L 33/325* (2013.01)

(58) Field of Classification Search
CPC .......... H01L 33/04; H01L 33/24; H01L 33/32
See application file for complete search history.

(56) References Cited

U.S. PATENT DOCUMENTS

| 5,780,867 A | 7/1998 | Fritz et al. |
| 6,121,634 A | 9/2000 | Saito et al. |

(Continued)

FOREIGN PATENT DOCUMENTS

| JP | 10145000 A | 5/1998 |
| JP | 10294532 A | 11/1998 |

(Continued)

OTHER PUBLICATIONS

International Search Report (ISR) and Written Opinion dated Jul. 12, 2016 issued in International Application No. PCT/JP2016/058952.

(Continued)

*Primary Examiner* — Kyoung Lee
*Assistant Examiner* — Christina Sylvia
(74) *Attorney, Agent, or Firm* — Holtz, Holtz & Volek PC

(57) ABSTRACT

A semiconductor light-emitting element according to the present invention is a semiconductor light-emitting element including: a first semiconductor layer of a first conductivity type; a light-emitting functional layer formed on the first semiconductor layer; and a second semiconductor layer that is formed on the light-emitting functional layer and is of a second conductivity type opposite to that of the first semiconductor layer. The light-emitting functional layer has: a base layer formed on the first semiconductor layer, the base layer having a plurality of base segments that have a (Continued)

composition subject to stress strain from the first semiconductor layer and are formed in a random net shape, the base layer being doped with a dopant of the second conductivity type; and a quantum well light-emitting layer formed on the base layer.

6 Claims, 3 Drawing Sheets

(51) Int. Cl.
  *H01L 33/06* (2010.01)
  *H01L 33/14* (2010.01)
  *H01L 33/12* (2010.01)

(56) References Cited

U.S. PATENT DOCUMENTS

| 2005/0129078 | A1* | 6/2005 | Johnson | B82Y 20/00 372/50.1 |
|---|---|---|---|---|
| 2008/0073657 | A1 | 3/2008 | Liang et al. | |
| 2009/0206320 | A1 | 8/2009 | Chua et al. | |
| 2012/0077298 | A1 | 3/2012 | Liang et al. | |
| 2016/0118539 | A1 | 4/2016 | Sugiyama et al. | |

FOREIGN PATENT DOCUMENTS

| JP | 2008535215 A | 8/2008 |
|---|---|---|
| JP | 4984119 B2 | 7/2012 |
| WO | 2014181558 A1 | 11/2014 |
| WO | 2016072276 A1 | 5/2016 |

OTHER PUBLICATIONS

Soh, et al, "Cool white III-nitride light emitting diodes based on phosphor-free indium-rich InGaN nanostuctres," Applied Physics Letters, 92, 2008, pp. 261909-1 to 261909-3.

Shioda, et al, "A Proposal of InGaN-Based Multiple-Colored Light Emitting Devices Using Selective Area Metal-Organic Vapor Phase Epitaxy," IEICE Technical Report, Electron Devices, Nov. 27, 2008, 108(321), pp. 13-16.

* cited by examiner

SEMICONDUCTOR LIGHT-EMITTING ELEMENT

TECHNICAL FIELD

The present invention relates to a semiconductor light-emitting element, such as a light-emitting diode (LED).

BACKGROUND ART

A semiconductor light-emitting element is usually produced by growing, on a growth substrate, a semiconductor structure layer including an n-type semiconductor layer, an active layer, and a p-type semiconductor layer and forming an n-type electrode and a p-type electrode that apply voltage to the n-type semiconductor layer and the p-type semiconductor layer, respectively.

Patent Literature 1 discloses a semiconductor light-emitting element including an active layer that is laminated on a substrate and has a surface containing a portion whose inclination angle smoothly changes with respect to the substrate as well as a method of manufacturing the same. Also, Non-Patent Literature 1 discloses a light-emitting diode including an active layer of a multi-quantum well structure where an InGaN layer is laminated on another InGaN layer of a nanostructure with a high indium composition.

CITATION LIST

Patent Literature

Patent Literature 1: Japanese Patent No. 4984119

Non-Patent Literature

Non-patent Literature 1: Applied Physics Letters 92, 261909 (2008)

SUMMARY OF INVENTION

Technical Problem

A semiconductor light-emitting element emits light by binding (recombination), in the active layer, of an electron and hole injected into the element through electrodes. The wavelength of light emitted from the active layer (i.e., emitted light color) differs depending on the band gap of the semiconductor material constituting the active layer. For example, a light-emitting element using a nitride-based semiconductor emits blue light from its active layer.

A light source is eventually required to have color rendering properties for, for example, lighting applications. A light source with high color rendering properties is a type of light source that emits near natural light. To achieve high color rendering properties, it is preferable that light whose wavelength substantially covers the entire wavelength of the visible region is extracted from a light source. For example, light extracted from a light source with high color rendering properties is observed as white light.

Various techniques of using a semiconductor light-emitting element to acquire white light have been proposed. In one example technique of producing a light-emitting apparatus, a wavelength conversion material, such as a phosphor, is mixed into a sealing resin to seal the element by the sealing resin. For example, in the case of a semiconductor light-emitting element using an active layer that emits blue light, a part of the blue light from the active layer is converted into yellow light by a phosphor, and two types of light are mixed and emitted to the outside. The emitted light as a whole is thus observed as white light. Also, for example, Patent Literature 1 proposes a technique of broadening the light-emitting wavelength bandwidth without using a phosphor by forming an uneven pattern using a treatment technique, such as etching, prior to active layer growth and forming an inclined surface on the active layer.

However, a light-emitting apparatus produced using the aforementioned techniques has problems relating to the uniformity of the light-emitting wavelength in the apparatus, the complexity of the manufacturing process, and light-emission intensity. Example problems include addition of a phosphor mixing step, changes of the wavelength conversion efficiency of the phosphor over time, addition of a step of processing a semiconductor layer, and degradation of crystallinity due to the processing of the semiconductor layer.

The present invention has been made in view of the aforementioned problems. An object of the present invention is to provide a semiconductor light-emitting element that does not require a wavelength conversion member, such as a phosphor, has high color rendering properties with a broad light-emitting wavelength band (spectral width) in the visible region and a high light-emission intensity, and provides the ease of control of the light-emitting wavelength bandwidth and high reproducibility of the light-emitting wavelength.

Solution to Problem

The semiconductor light-emitting element according to the present invention includes: a first semiconductor layer of a first conductivity type; a light-emitting functional layer formed on the first semiconductor layer; and a second semiconductor layer that is formed on the light-emitting functional layer and is of a second conductivity type opposite to that of the first semiconductor layer. The light-emitting functional layer has: a base layer formed on the first semiconductor layer, the base layer having a plurality of base segments that have a composition subject to stress strain from the first semiconductor layer and are formed in a random net shape, the base layer being doped with a dopant of the second conductivity type; and a quantum well light-emitting layer formed on the base layer.

DESCRIPTION OF EMBODIMENTS

Figure 1A:
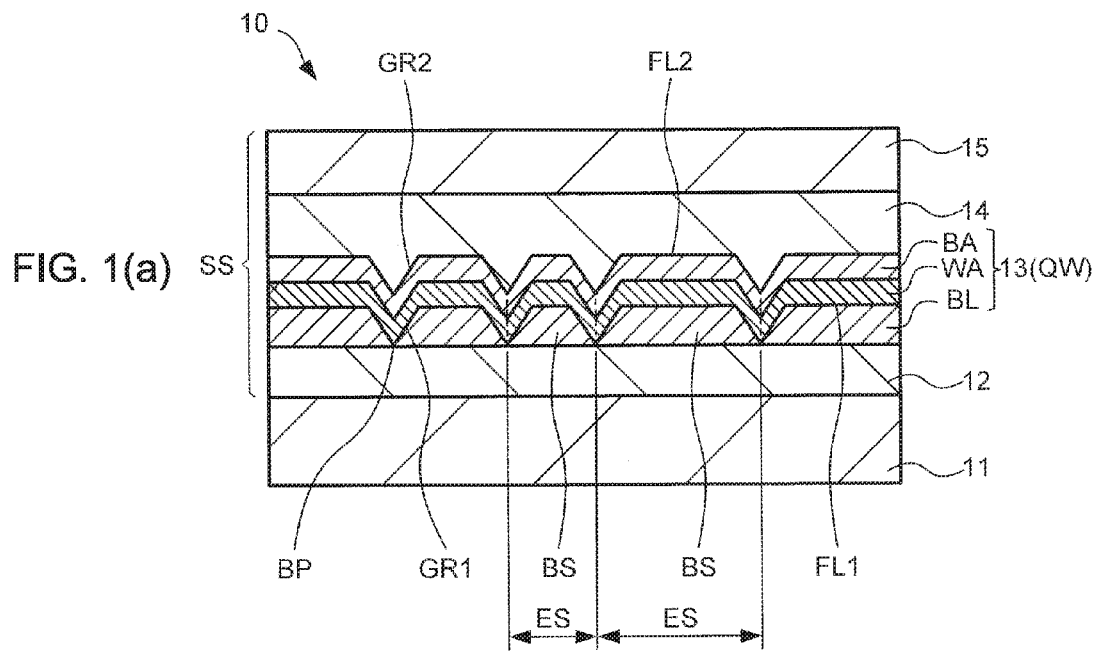
FIG. 1(a) is a cross-sectional view illustrating a structure of a semiconductor light-emitting element according to a first embodiment.

Embodiments of the present invention will be described in detail hereinbelow. In this specification, an identical reference numeral is assigned to an identical or equivalent constituent element.

First Embodiment

FIG. 1(a) is a cross-sectional view illustrating a structure of a semiconductor light-emitting element (hereinafter may be simply referred to as a light-emitting element or an element) 10 according to a first embodiment. In the structure of the semiconductor light-emitting element 10, a semiconductor structure layer SS is formed on a mounting substrate formed from sapphire (hereinafter may be simply referred to as a substrate) 11. A concrete description will be hereinbelow given of the semiconductor structure layer SS.

An n-type semiconductor layer 12 as a first semiconductor layer is formed from, for example, a GaN layer including an n-type dopant (for example, Si). A light-emitting functional layer 13 is a layer that has a quantum well structure QW formed on the n-type semiconductor layer 12. The light-emitting functional layer 13 will be described in detail hereinbelow.

An electron blocking layer 14 is formed on the light-emitting functional layer 13 and is formed from, for example, an AlGaN layer. A p-type semiconductor layer 15 is formed on the electron blocking layer 14 and is formed from, for example, a GaN layer including a p-type dopant (for example, Mg). The n-type semiconductor layer 12 may include a plurality of n-type semiconductor layers with different dopant concentrations. Also, the electron blocking layer 14 may include a p-type dopant. In addition, the p-type semiconductor layer 15 may have a contact layer on the principal surface opposite from the interface with the electron blocking layer 14.

The light-emitting functional layer 13 will be described in detail hereinbelow. The light-emitting functional layer 13 may have a plurality of light-emitting functional layers, but this embodiment will be described with reference to a case where the light-emitting functional layer 13 includes one light-emitting functional layer.

A base layer BL is a layer that is formed on the n-type semiconductor layer 12 and is formed from AlN doped with, for example, Mg. The base layer BL has a groove GR1 that is subject to stress from the n-type semiconductor layer 12 and formed in a random net shape.

The groove GR1 is formed by a plurality of combined groove portions created by stress strain generated in the base layer BL due to the composition difference between the n-type semiconductor layer 12 and the base layer BL, and the groove GR1 has a mesh shape as a whole. The stress strain generated in the base layer BL is generated by strain of the crystal structure of the base layer BL caused by the lattice constant difference between the n-type semiconductor layer 12 and the base layer BL.

The stress strain generated in the base layer BL changes with a change in the amount of Mg doped into the base layer BL. As the amount of Mg doped into the base layer BL increases, the stress strain generated in the base layer BL in the compression direction, in other words, compressive strain, decreases.

Figure 1B:
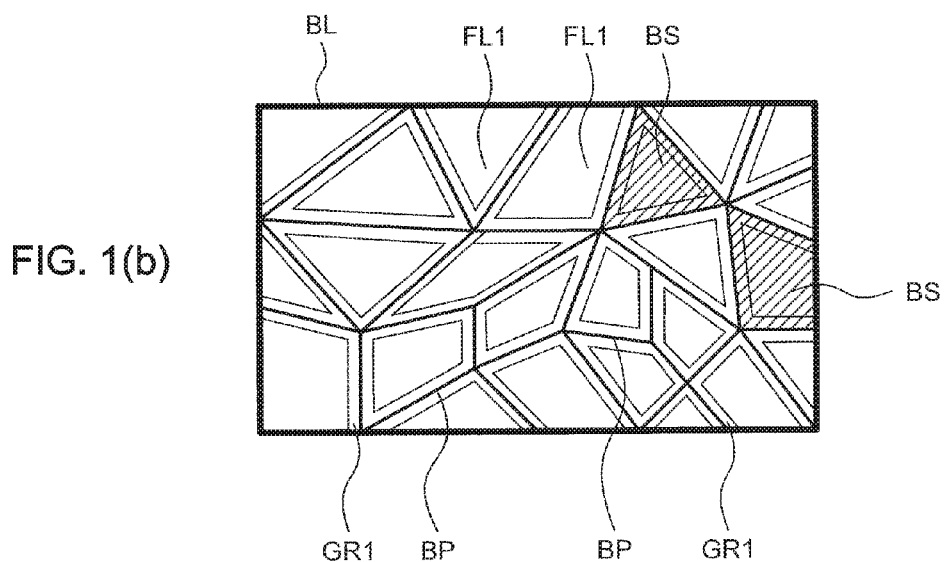
FIG. 1(b) is a schematic top plan view illustrating a base layer of a light-emitting functional layer.

The base layer BL will be described with reference to FIG. 1(b) hereinbelow. FIG. 1(b) is a schematic view illustrating the upper surface of the base layer BL. The base layer BL has many fine base segments BS that are partitioned by a first groove GR1 and formed to have random sizes. The base segments BS are defined to have a random net shape since the base layer BL is subject to stress strain from the n-type semiconductor layer 12.

The first groove GR1 is constituted of groove portions with random and different lengths and shapes. The first groove GR1 is formed in a net (mesh) shape all over the surface of the base layer BL. Each base segment BS is a portion (segment) that is formed by random division of the base layer BL by the groove GR1. The upper surfaces of the base segments BS respectively have various shapes, such as substantially round and oval shapes or a polygonal shape.

As illustrated in FIG. 1(a), the first groove GR1 is, for example, V-shaped and has a line-like bottom portion BP. In this embodiment, an end portion of each base segment BS is the bottom portion BP of the first groove GR1. Each base segment BS adjoins another base segment BS at the bottom portion BP.

Further, the base layer BL has a flattened portion (hereinafter referred to as "first flattened portion") FL1, which corresponds to each base segment BS. The surface of the base layer BL is constituted of the first flattened portion FL1 and the side wall surface of the first groove GR1. Each first flattened portion FL1 is defined by the first groove GR1 for each base segment BS. The base segment BS has an upper surface formed from the first flattened portion FL1 and side surfaces formed from the side wall surfaces of the first groove GR1.

Specifically, the first flattened portion FL1 constitutes an upper surface of each base segment BS, and the inner wall surface of the first groove GR1 constitutes the side surface of the base segment BS. Accordingly, each base segment BS has an inclined side surface and has a cross-sectional shape of, for example, substantially trapezoid.

As described above, the stress strain generated in the base layer BL changes with, for example, changes in the crystallinity and lattice constant of the base layer BL. The shapes and sizes of the groove GR1 and the base segment BS of the base layer BL thereby change. As the compressive strain generated in the base layer BL decreases, the size of the base segment BS tends to increase.

A quantum well layer WA is formed on the base layer BL. The quantum well layer WA is a layer made of, for example, InGaN. The quantum well layer WA is formed to follow (maintain) the shape of the first groove GR1 on its surface and has a groove that has the same mesh shape as that of the first groove GR1. Specifically, the quantum well layer WA has an uneven shape corresponding to the first groove GR1 on its interface with the base layer BL (lower surface) and its upper surface. The quantum well layer WA is formed as a so-called strained quantum well layer.

A barrier layer BA is formed on the quantum well layer WA. The barrier layer BA is a layer made of, for example, an undoped AlN layer. As in the case of the quantum well layer WA, the barrier layer BA is formed to follow (maintain) the shape of the first groove GR1 on its surface and has a groove that has the same mesh shape as that of the first groove GR1. Its two main surfaces are formed as flattened surfaces. Specifically, the barrier layer BA is formed on the first flattened surface FS1 of the quantum well layer WA, and the upper surface of the barrier layer BA is formed as a flattened surface (hereinafter referred to as a second flattened surface) FS2.

It is preferable that the quantum well layer WA be an undoped layer. In this case, the semiconductor structure layer SS has a structure in which the n-type semiconductor layer 12, the p-type base layer BL, the undoped quantum well layer WA, the barrier layer BA, and the p-type semiconductor layer 15 are laminated in this order.

Specifically, as illustrated in FIG. 1(a), the quantum well layer WA and the barrier layer BA are formed on the base layer BL with the segment shape of the base segment BS unchanged. Thus, the quantum well layer WA and the barrier layer BA have a groove at a location corresponding to each groove portion of the first groove GR1 of the base layer BL. Specifically, a groove formed in the barrier layer BA, which is the nearest layer to the p-type semiconductor layer 15, is a second groove GR2.

The portion of the surface of the light-emitting functional layer 13, i.e., the surface of the barrier layer BA, other than the second groove GR2 is formed as a flattened portion (hereinafter, referred to as a second flattened portion) FL2. Each second flattened portion FL2 is formed so that its location and shape correspond to those of each first flat portion FL1.

In other words, the light-emitting functional layer 13 has, on its surface, the second flattened portion FL2 and the second groove GR2. The second groove GR2 is formed to partition the light-emitting functional layer 13 into a plurality of island-shaped light-emitting segments ES.

Each light-emitting segment ES is formed so as to correspond to each base segment BS. Specifically, on the surface of the light-emitting functional layer 13, the light-emitting segments ES are defined and formed in a random net shape. The sizes and shapes of the light-emitting segments ES are randomly deviated and distributed and are randomly disposed (on a parallel basis) on the surface of the first light-emitting functional layer 13.

The aforementioned base layer BL serves as a barrier layer for the quantum well layer WA, and a quantum well light-emitting layer QW is formed by the base layer BL, the quantum well layer WA, and the barrier layer BA. Further, a quantum well structure layer is formed by the quantum well layer WA and the barrier layer BA.

The electron blocking layer 14 formed on the barrier layer BA of the light-emitting functional layer 13 is formed to bury the second groove GR2. Specifically, at the interface (lower surface) with the barrier layer BA, the electron blocking layer 14 has an uneven shape corresponding to the groove GR2. The upper surface of the electron blocking layer 14 is a flattened surface.

Hereinbelow, a description will be given of a procedure of forming the light-emitting functional layer 13, generation of strain, formation of the base segment BS, and changes in the light-emitting wavelength of the light emitted from the quantum well layer WA according to the size of the base segment. The base segment BS, which is formed by strain caused by the base layer BL, can be formed by growing the base layer BL on the n-type semiconductor layer 12, which is a GaN layer, at a relatively low growth temperature.

Firstly, the base layer BL, whose crystal composition differs from that of the n-type semiconductor layer 12, is formed on the n-type semiconductor layer 12 to allow stress (strain) to be generated in the base layer BL. For example, when an AlN layer as the base layer BL is formed on a GaN layer as the n-type semiconductor layer 12, tensile strain is generated in the AlN layer due to the lattice mismatch between the AlN layer and the GaN layer.

Therefore, tensile stress is generated in the AlN layer during its growth. Accordingly, a groove is formed in the AlN layer at the beginning of or during growth of the AlN layer, and the AlN layer grows in a three-dimensional manner thereafter. Specifically, the AlN layer is grown in a stereoscopic manner, and a plurality of fine protrusions and recesses are formed. The starting point of formation of this groove is the bottom portion BP of the groove GR1.

Also, when an AlN layer is grown on a GaN layer at a low temperature, growth of the AlN layer in a three-dimensional manner is promoted. Therefore, a very large number of grooves are combined with each other and formed (groove GR1) on the surface of the AlN layer, whereby the AlN layer is divided into a plurality of segments. The base layer BL with the base segments BS can thus be formed. In this embodiment, the AlN layer was formed as the base layer BL at a growth temperature of 780° C.

When an InGaN layer as the quantum well layer WA is formed on this base layer BL, as described above, the quantum well layer WA is exposed to compressive strain and formed as a strained quantum well layer. Further, the distribution of the In content differs depending on the region of the quantum well layer WA. Specifically, the quantum well layer WA is formed such that, for example, the region on the flattened portion FL1 differs from the region on the groove GR1 in terms of In composition.

Also, the layer thickness of the quantum well layer WA on the upper surface of the base segment BS differs from that on the side surface of the base segment BS. Therefore, within the quantum well layer WA, the band gap is not constant. Various colors of light are emitted from the light-emitting functional layer 13 with fine island-shaped recesses and protrusions.

Under compressive strain, an InGaN layer as the quantum well layer WA tends to incorporate In. The band gap of the InGaN layer, in other words, the energy between quantum levels, is thereby considered to decrease. Therefore, the wavelength of the light emitted from the quantum well layer WA formed from an InGaN layer under compressive strain is longer than that of light from InGaN not under compressive strain.

As the compressive strain exerted on the InGaN layer increases, in other words, as the size of the base segment BS decreases, the amount of incorporated In, in other words, the In composition, increases. Conversely, as the compressive strain decreases, in other words, as the size of the base segment BS increases, the amount of incorporated In, in other words, the In composition, decreases.

Accordingly, by adjusting the amount of Mg dopant doped into the base layer BL, the compressive strain exerted on the quantum well layer WA can be adjusted, and the light-emitting wavelength of the light emitted from the quantum well layer WA can be controlled.

In the semiconductor light-emitting element 10 according to the present invention, the quantum well layer WA is formed on the base layer BL having the groove GR1 with presence of compressive strain. As described above, the In content thereby becomes uneven in the quantum well layer WA, and the thickness of the quantum well layer WA is made uneven within the layer. Accordingly, as the band gap within the quantum well layer WA becomes uneven, light with a wide wavelength bandwidth and high color rendering properties can be acquired.

Further, as described above, as the amount of Mg doped into the base layer BL increases, the compressive strain generated in the base layer BL decreases. Also, as described above, as the compressive strain decreases, the amount of In incorporated into the quantum well layer WA decreases, and the band gap of the InGaN layer increases.

Therefore, in the semiconductor element 10 of the present invention, by increasing the amount of Mg doped into the base layer BL, the wavelength of the light emitted from the quantum well layer WA can be shifted to the shorter wavelength side. Conversely, by decreasing the amount of Mg doped into the base layer BL, the wavelength of the light emitted from the quantum well layer WA can be shifted to the longer wavelength side. Specifically, by adjusting the amount of Mg doped into the base layer BL, the light-emitting wavelength of the light-emitting element 10 can be adjusted.

When the amount of Mg doped into the base layer BL was set to $2\times10^{19}$ atoms/cm$^3$, light with a peak near 500 nm in a wavelength bandwidth of 460 to 580 nm could be acquired from the light-emitting functional layer 13. Also, when the amount of Mg doped into the base layer BL was experimentally set to 0, light with a peak near 570 nm in a wavelength bandwidth of 510 to 650 nm could be acquired.

Also, as described above, in this embodiment, the Mg-doped base layer BL is formed, and the quantum well layer WA was formed thereon. With this configuration, the present inventors have found that a light-emitting element with a high level of emitted light reproducibility can be formed by reducing changes in the compressive strain generated in the base layer BL and the sizes of the base segments BS relative to changes by the growth conditions.

[First Modified Example]

Figure 2:
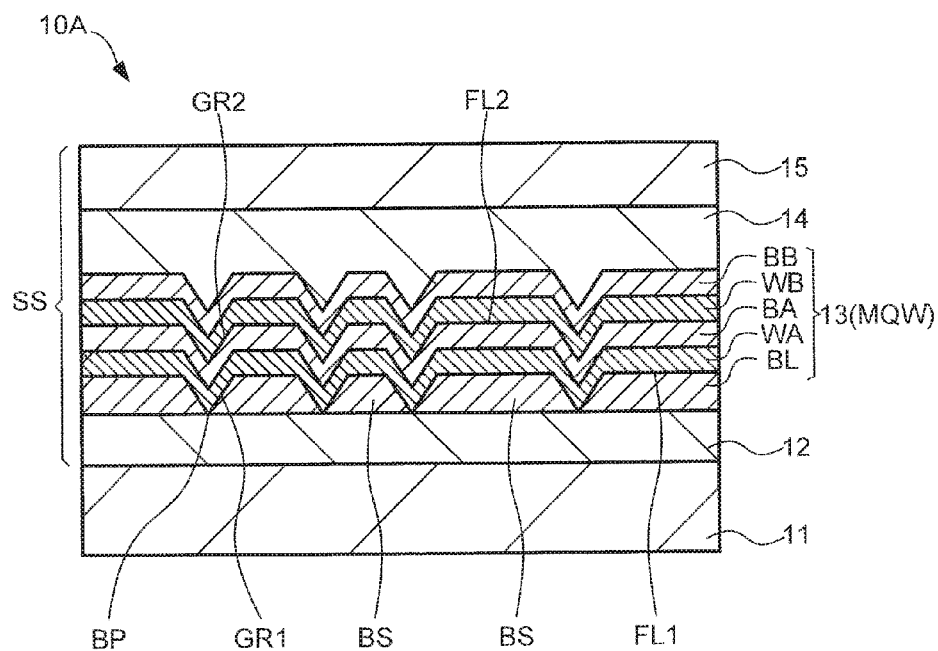
FIG. 2 is a cross-sectional view illustrating a structure of a semiconductor light-emitting element according to a modified example of the first embodiment.

FIG. 2 is a cross-sectional view illustrating a structure of a semiconductor light-emitting element 10A according to a first modified example of the first embodiment. Except for the configuration of the light-emitting functional layer 13, the configuration of the light-emitting element 10A is the same as that of the light-emitting element 10. The light-emitting functional layer 13 has a structure in which a plurality of quantum well layers (two layers in this modified example) are laminated. More specifically, the light-emitting functional layer 13 has a structure in which the base layer BL, the quantum well layer WA, the barrier layer BA, a quantum well layer WB, and a barrier layer BB are laminated in this order.

As in the case of the semiconductor light-emitting element 10, the base layer BL of the semiconductor light-emitting element 10A functions as a barrier layer for the quantum well layer WA. Accordingly, a multi-quantum well light-emitting layer MQW is formed by the base layer BL, the quantum well layer WA, the barrier layer BA, the quantum well layer WB, and the barrier layer BB. In this case, the barrier layers BA, BB were undoped.

In this manner, the light-emitting functional layer 13 may be of a multi-quantum well structure in which two or more quantum well layers WA are included.

In this case, the quantum well structures (WA, BA) on the base layer BL side and the other quantum well structures (WB, BB) formed thereon differ in unevenness in the in-plane distribution of the composition (In content) and the total thickness. Therefore, in this modified example where a plurality of quantum well structures (MQW) are included, as the non-uniformity of the band gap (energy between quantum levels) increases, the spectral width of emitted light is wider than that of the single quantum well (first embodiment).

Second Embodiment

Figure 3:
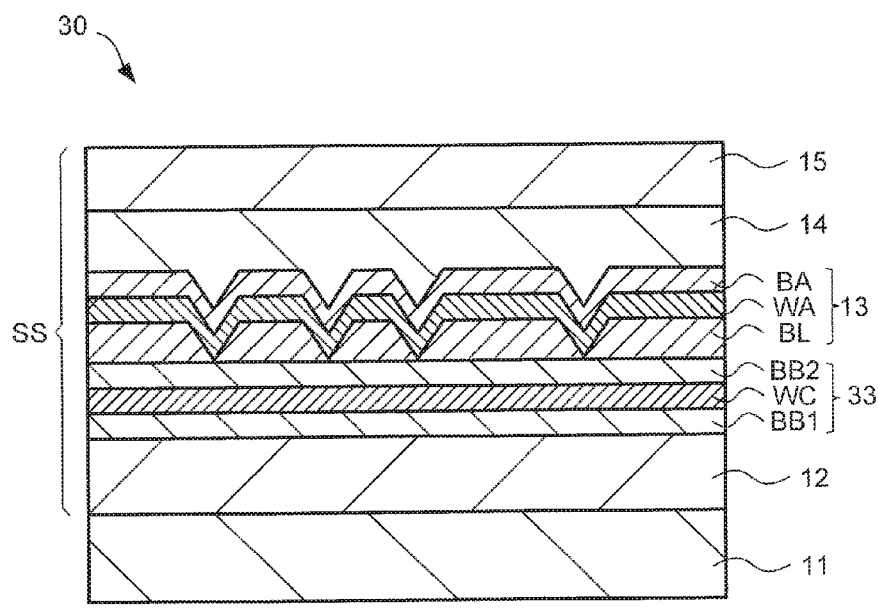
FIG. 3 is a cross-sectional view illustrating a structure of a semiconductor light-emitting element according to a second embodiment.

FIG. 3 is a cross-sectional view illustrating a structure of a semiconductor light-emitting element 30 according to a second embodiment. Except for the configuration in which a light-emitting functional layer 33 is added as a second light-emitting functional layer, the configuration of the light-emitting element 30 is the same as that of the semiconductor light-emitting element 10. The light-emitting functional layer 33 as the second light-emitting functional layer is formed between the n-type semiconductor layer 12 and the light-emitting functional layer 13 as the first light-emitting functional layer of the light-emitting element 10. The light-emitting functional layer 33 is formed so that the center light-emitting wavelength and band gap thereof differ from those of the light-emitting functional layer 13.

In this embodiment, the light-emitting functional layer 33 has a structure in which a uniformly flattened quantum well layer WC is placed between two barrier layers BB1 and BB2 on the n-type semiconductor layer 12. The light-emitting functional layer 13 (base layer BS) is formed on the barrier layer BB2, which is the nearest to the p-type semiconductor layer 15. The quantum well layer WC has the same configuration as that of the quantum well layer WA, for example, the InGaN composition. Each of the barrier layers BB1, BB2 has the same configuration as that of the n-type semiconductor layer 12, for example, the GaN composition.

In this embodiment, the light-emitting layer 33 of a quantum well structure is added to the side of the n-type semiconductor layer 12 of the light-emitting functional layer 13 of the light-emitting element 10 of the first embodiment. The light-emitting functional layer 33 is formed on the flattened surface of the n-type semiconductor layer 12 and emits light whose wavelength is shorter than the light emitted from the light-emitting functional layer 13, for example, blue light with a wavelength of approximately 450 nm.

Therefore, compared with the first embodiment, the semiconductor light-emitting element 30 of this embodiment can additionally release light with a light-emitting wavelength peak in a pure blue region. This embodiment is advantageous for a case in which, for example, the intensity of blue-region light from a semiconductor light-emitting element is to be increased.

Further, by forming the base layer BL doped with Mg, which is a p-type dopant, as described above, the light-emitting wavelength can be controlled for the light-emitting functional layer 13, and light-emitting wavelength reproducibility can be improved.

Further, since the efficiency of hole injection into the light-emitting functional layer 33A is higher when the Mg-doped base layer BL is formed on the barrier layer BB2 than when the base layer BB is formed directly on the barrier layer BB2, the light emitted from the light-emitting functional layer 33 can be increased.

Figure 4:
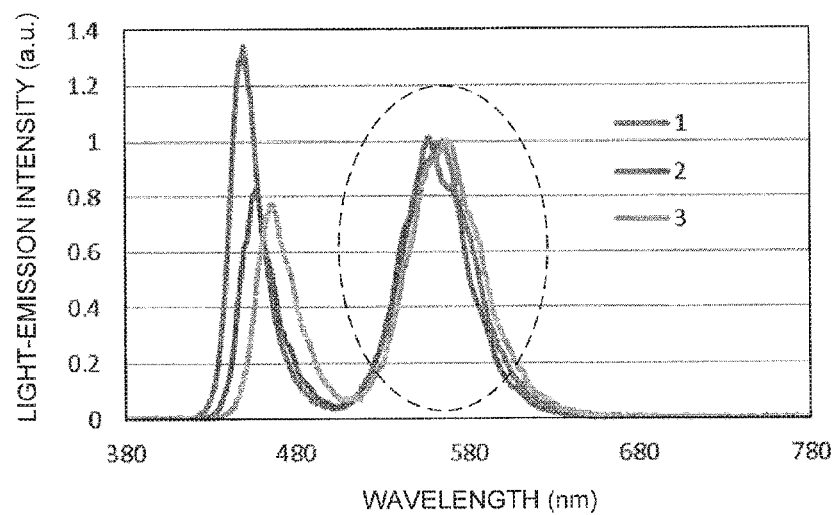
FIG. 4 is a view illustrating the light emission spectrum from the semiconductor light-emitting element according to the second embodiment.

FIG. 4 illustrates the light emission spectrum from three light-emitting elements 30 that were manufactured as the semiconductor light-emitting elements 30 of the second embodiment in which the amount of Mg doped into the base layer BL was $2\times10^{19}$ atoms/cm$^3$. The area surrounded by the dashed line in FIG. 4 represents the light emission spectrum of the light emitted from the light-emitting functional layer 13.

As illustrated in FIG. 4, when Mg is doped into the base layer BL, the light-emitting wavelength peak shifts little between light-emitting elements. Therefore, by doping Mg into the base layer BL, it can be understood that a light-emitting element with a high level of light-emitting wavelength reproducibility can be manufactured.

Third Embodiment

Figure 5:
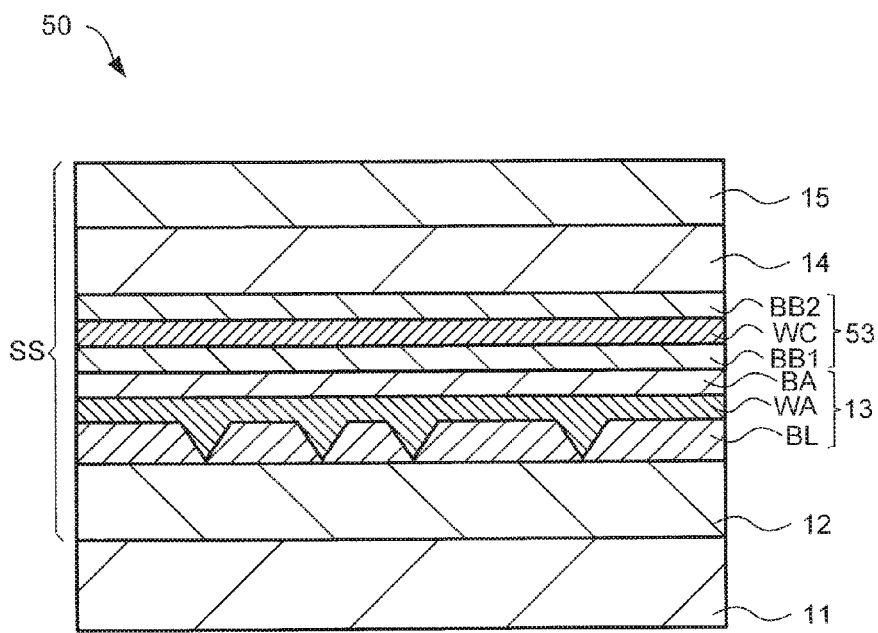
FIG. 5 is a cross-sectional view illustrating a structure of a semiconductor light-emitting element according to a third embodiment.

FIG. 5 is a cross-sectional view illustrating a structure of a semiconductor light-emitting element 50 according to a third embodiment. In the light-emitting element 50, a light-emitting functional layer 53, which is an equivalent of the light-emitting functional layer 33 of the second embodiment, is formed closer to the side of the p-type semiconductor layer 15 than the light-emitting element 13 is.

In the light-emitting element 50, the light-emitting functional layer 53 is formed on a layer with a flattened surface so that blue light is emitted from the light-emitting functional layer 53. Therefore, as illustrated in the figure, in the light-emitting functional layer 13, the quantum well layer WA is formed so that the groove GR1 is buried and the surface of the WA is flattened.

In the structure of the light-emitting functional layer 53, the uniformly flattened quantum well layer WC is interposed between the two barrier layers BB1 and BB2 on the barrier layer BA. The quantum well layer WC, for example, has the same configuration as that of the quantum well layer WA, for example, the same InGaN composition. Each of the barrier layers BB1 and BB2 has the same configuration as that of the n-type semiconductor layer 12, for example, the same GaN composition.

In this embodiment, the light-emitting functional layer 53 of a quantum well structure is added to the side of the p-type semiconductor layer 15 of the light-emitting functional layer 13 in the light-emitting element 10 of the first embodiment. The light-emitting functional layer 33 is formed on the flattened surface of the barrier layer BA and emits light whose wavelength is shorter than the light emitted from the light-emitting functional layer 13, for example, blue light with a wavelength of approximately 450 nm.

Therefore, compared with the first embodiment, the semiconductor light-emitting element 30 of this embodiment can additionally emit light with a light-emitting wavelength peak in a pure blue region. The configuration of this embodiment is advantageous for a case in which, for example, the intensity of blue-region light from a semiconductor light-emitting element is to be increased.

A configuration of including a plurality of the light-emitting functional layers 13 is possible. In such a configuration, another base layer, another quantum well layer, and another barrier layer may be laminated in this order on the barrier layer BA. In this case, Mg may be doped into any of the base layers or may be doped into a plurality of base layers. Also, when doping is performed for a plurality of base layers, the dopant concentration of each base layer may differ.

Further, the semiconductor light-emitting element may be configured to include both the light-emitting functional layer 33 of the second embodiment and the light-emitting functional layer 53 of the third embodiment. Specifically, the configuration in which the light-emitting functional layer 13 is interposed between the light-emitting functional layers 33 and 53 is possible.

The aforementioned embodiments are described with reference to the case in which the first conductivity type is n-type and the second conductivity type is p-type, which is the opposite type of n-type. However, the first conductivity type may be p-type, and the second conductivity type may be n-type.

The aforementioned embodiments are described with reference to the case in which the light-emitting element 10 has the structure where the semiconductor structure layer SS is formed on a growth substrate serving as the mounting substrate 11. However, these embodiments are not limited to the structure where the mounting substrate 11 serves as a growth substrate. For example, the semiconductor light-emitting elements 10, 10A, 30, and 50 may have a structure obtained by bonding the semiconductor structure layer SS, which is first formed on a growth substrate, onto another substrate (support substrate) and removing the growth substrate. In this case, the other bonded substrate is bonded onto the p-type semiconductor layer 15. The bonded substrate may use a material with a high level of heat dissipation, such as Si, AlN, Mo, W, or CuW.

Moreover, in the aforementioned embodiments, Mg is doped into the base layer BL. However, a dopant doped into the base layer BL is not limited to Mg, but may be a p-type dopant other than Mg.

Also, the aforementioned embodiments are described with reference to the example where the base layer BL is a layer formed from AlN. However, the base layer BL may be a layer formed from AlGaN.

In addition, although not illustrated in the drawings, between the mounting substrate 11 and the n-type semiconductor layer 12, a buffer layer (underlayer) may be provided to mitigate strain that can be generated in an interface between the growth substrate and the semiconductor structure layer SS and in an interface between respective layers of the semiconductor structure layer SS.

The numerical values, dimensions, materials, etc., of the aforementioned embodiments are merely examples and can be appropriately selected depending on the application and the light-emitting element to be manufactured.

REFERENCE SIGNS LIST 10, 10A, 30, 50 semiconductor light-emitting element
12 n-type semiconductor layer (first semiconductor layer)
13, 33, 53 light-emitting functional layer
14 electron blocking layer
15 p-type semiconductor layer (second semiconductor layer)
BL base layer
BS base segment
GR1, GR2 groove
WA, WB, WC quantum well layer

The invention claimed is:

1. A semiconductor light-emitting element comprising:
a first semiconductor layer of a first conductivity type;
a light-emitting functional layer formed on the first semiconductor layer; and
a second semiconductor layer that is formed on the light-emitting functional layer and is of a second conductivity type opposite to that of the first semiconductor layer, wherein
the light-emitting functional layer includes:
   a base layer formed on the first semiconductor layer, the base layer having a plurality of base segments that have a composition subject to stress strain from the first semiconductor layer and are formed in a random net shape, the base layer being doped with a dopant of the second conductivity type; and
   a quantum well structure layer formed on the base layer.

2. The semiconductor light-emitting element according to claim 1, wherein the quantum well structure layer is an undoped layer.

3. The semiconductor light-emitting element according to claim 1, wherein the dopant of the doped layer is Mg.

4. The semiconductor light-emitting element according to claim 1, wherein:
the first semiconductor layer has a GaN composition;
the quantum well structure has a quantum well layer and a barrier layer formed on the base layer;
the base layer and the barrier layer have an AlN or AlGaN composition; and
the quantum well layer has an InGaN composition.

5. The semiconductor light-emitting element according to claim 1, further comprising a second light-emitting functional layer, having a uniformly flattened quantum well structure, between the base layer and the first semiconductor layer or between the light-emitting functional layer and the second semiconductor layer.

6. The semiconductor light-emitting element according to claim 5, wherein a center light-emitting wavelength of the second light-emitting functional layer differs from a center light-emitting wavelength of the quantum well layer.

* * * * *